United States Patent [19]
Rosetti et al.

[11] Patent Number: 4,963,971
[45] Date of Patent: Oct. 16, 1990

[54] SYMMETRICAL POWER SEMICONDUCTOR DEVICE AND METHOD OF FABRICATION

[75] Inventors: Pierre Rosetti, Fontenay Aux Roses; Yvette Ribault, Montrouge, both of France

[73] Assignee: Telemecanique, France

[21] Appl. No.: 447,354

[22] Filed: Dec. 7, 1989

[30] Foreign Application Priority Data

Dec. 7, 1988 [FR] France ............... 88 106062

[51] Int. Cl.$^5$ .................. H01L 29/00; H01L 29/74; H01L 29/747; H01L 29/04
[52] U.S. Cl. .................................... 357/37; 357/38; 357/39; 357/48
[58] Field of Search ................ 357/37, 38, 39, 42, 357/48

[56] References Cited
FOREIGN PATENT DOCUMENTS 57-196571 3/1982 Japan .
0053973 3/1988 Japan .................................... 357/38

OTHER PUBLICATIONS

IBM Technical Data Bulletin, vol. 21, No. 4, Sep. 1978 pp. 1518-1519, New York, A. R. Harder et al. "Gas Mixture Control Permits Nonselective Reactive Ion Etch" p. 1518, Para.2-Figures.

Primary Examiner—Rolf Hille
Assistant Examiner—Wael Fahmy
Attorney, Agent, or Firm—William A. Drucker

[57] ABSTRACT

The invention relates to a symmetrical power semiconductor device having peripheral connection slabs and to a method of fabricating such a device. An essentially polycrystalline P/N epitaxial layer (23) lies flush with a main face (S1) of the device by virture of grooves (21) obtained by etching and overlaid with a peripheral P/N zone (25). A P/N layer (22) is diffused between the epitaxial layer (23) and a monocrystalline N/P layer (20) in order to establish a junction (J2) which the grooves (21) and the peripheral zone (25) serve to bring out on the main face (S1). The invention is applicable to symmetrical bipolar devices, and in particular to gate-triggered thyristors.

7 Claims, 2 Drawing Sheets

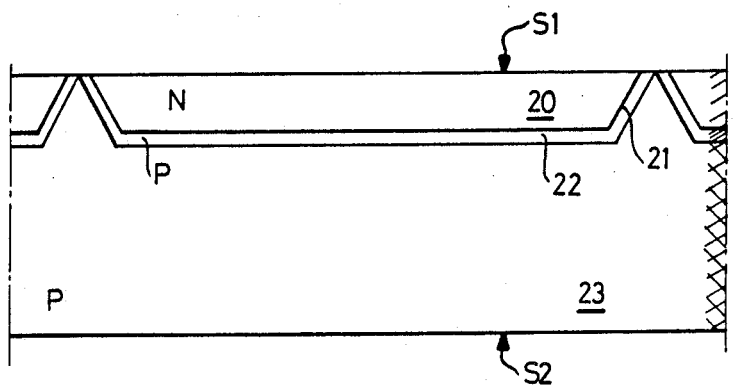
FIG_5
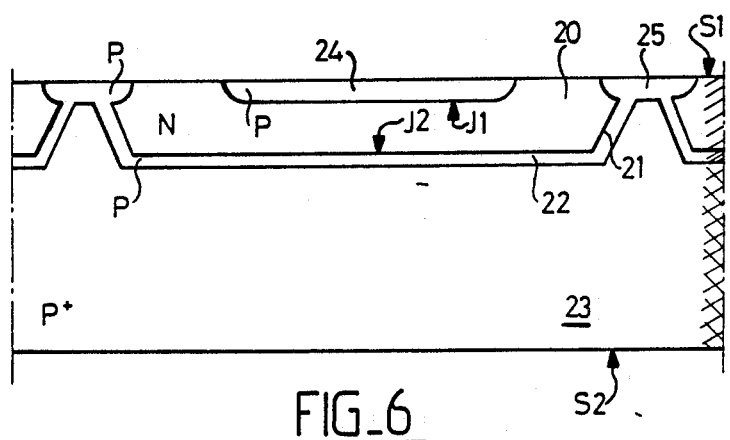
FIG_6
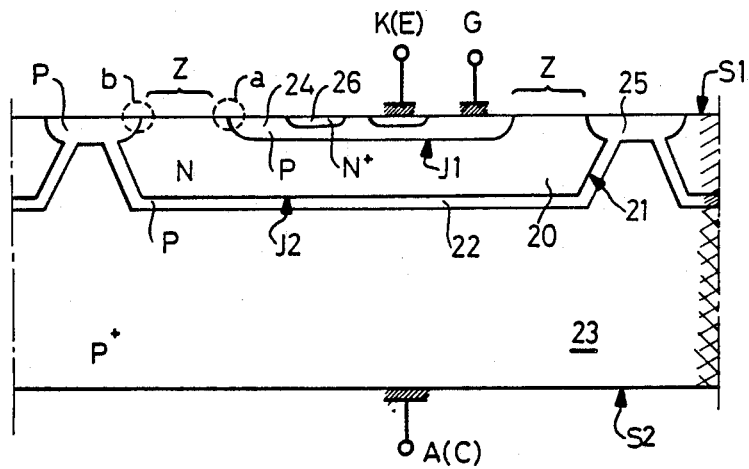
FIG_7

SYMMETRICAL POWER SEMICONDUCTOR DEVICE AND METHOD OF FABRICATION

The present invention relates to a symmetrical power semiconductor device provided with connection slabs. It also relates to a method of fabricating such a device.

BACKGROUND OF THE INVENTION

A symmetrical power semiconductor device must be capable of withstanding substantially the same voltage in both directions. In order to be able to withstand a voltage of about 1,000 volts, for example, it is particularly necessary to take effective peripheral dispositions, and for them to be as simple as possible to fabricate.

It is also advantageous to be able to take these dispositions on one face only of the semiconductor. In this context, a prior method consists in bringing the periphery of a bottom junction in a power semiconductor up to its top face by forming pairs of touching slabs which are diffused from both of the main faces of the semiconductor.

For high voltage devices, the slabs may reach a depth of at least 200 μm, and this requires a very long diffusion time. The provision of the slabs can be accelerated by thermomigration of aluminum, but such a method is difficult to implement without disturbing the other characteristics of the device.

The object of the invention is to bring out, on a first face of a symmetrical power semiconductor device, the periphery of a junction situated close to a second face of the device, while avoiding the difficulties inherent to diffusing deep peripheral slabs.

The invention also seeks to make such a device benefit from the facilities offered by epitaxial technology.

SUMMARY OF THE INVENTION

The symmetrical power semiconductor of the invention comprises:
an N/P first layer defining a first main face;
a P/N second layer optionally thicker than the first and defining a second main face;
the second layer coming flush with the first face by means of grooves obtained by etching;
a P/N third layer formed between the first and second layers, including over the facettes of the grooves, and determining a junction with the first layer;
a P/N fourth layer diffused on the first face in the first layer; and
a P/N peripheral zone diffused on the first face so as to overlie the tips of the grooves and to form, together therewith, slabs for providing connections with the junction with the first face.

The periphery of the PN junction close to the second face is thus brought out to the first face so that the conventional precautions required for ensuring that the device can withstand voltages in both directions are taken around a contour of the first face only.

The invention also provides a method of fabricating the above-described device from a slice of N/P monocrystalline silicon, and comprising the following steps:
etching grooves ,e.g. in the form of a network, on a face of the slice constituting the first layer;
depositing a thick layer of P/N silicon preferably by an epitaxial type of process on the face of the slice in which the grooves have been etched;
lapping the slice down to a first main face of the device which is approximately flush with the tips of the grooves; and
diffusing a P/N layer on the first main face of the fourth layer surrounded by the grooves, and diffusing a peripheral zone over the tips of the grooves.

The P/N epitaxial layer is essentially polycrystalline. It is either heavily doped during deposition, or else lightly doped during deposition, in which case it is overdoped by subsequent diffusion from the second main face, e.g. simultaneously with the diffusion of the fourth layer and of the peripheral zone.

The P/N third layer intermediate between the first and second layers is formed either by diffusion immediately after etching the grooves, or else by diffusion from the second layer if the second layer is sufficiently doped, e.g. simultaneously with the diffusion of the fourth layer and of the peripheral zone.

BRIEF DESCRIPTION OF THE DRAWINGS

An embodiment of the invention is described by way of example with reference to the accompanying drawings, in which:

FIGS. 2 to 7 show steps in the fabrication of a thyristor type symmetrical power semiconductor in accordance with the invention.

DETAILED DESCRIPTION

Figure 1:
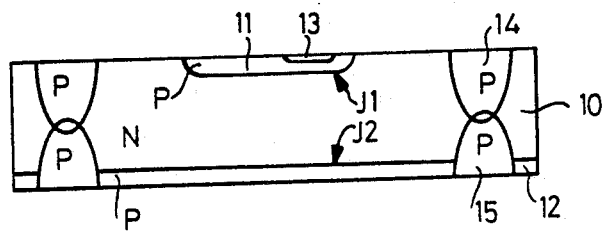
FIG. 1 is a diagrammatic section through a power semiconductor provided with connection slabs made using the conventional deep diffusion technique.

The conventional device shown in FIG. 1 comprises an N substrate 10 having P diffusion 11 over a portion of a first face (top face) and P diffusion 12 over a second face (bottom face). N diffusion 13 is provided in the layer 11. Mutually facing pairs of slabs 14, 15 are diffused around the zone 11 so as to meet each other and bring the PN junction J2 that exists between the zones 12 and 10 out in the top face of the device. Each slab is diffused to a depth which is greater than half the total thickness, thereby encountering the above-described drawbacks.

Figure 2:
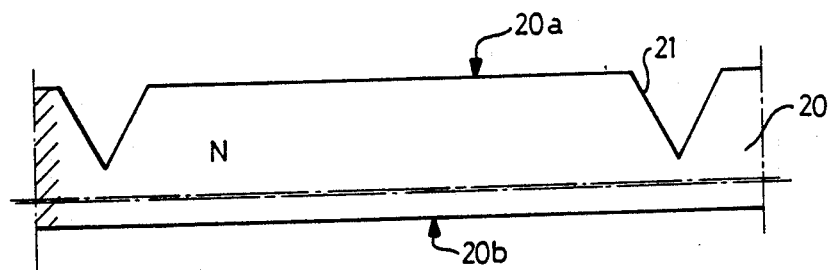

The symmetrical power semiconductor device of the invention is obtained from a slice 20 of N-doped monocrystalline silicon (FIG. 2). The types of doping specified herein may naturally be swapped over. An appropriate wet or dry method is used for etching deep grooves 21 in one of the faces 20a of the slice. The grooves may be V-shaped as shown, or they may be U-shaped. Thus, by anisotropic etching using <10-0> oriented silicon it is possible to obtain grooves 21 that are more than 200 μm deep. In practice, the depth of the grooves 21 will be equal to the depth of the active zone of the device.

Figure 3:
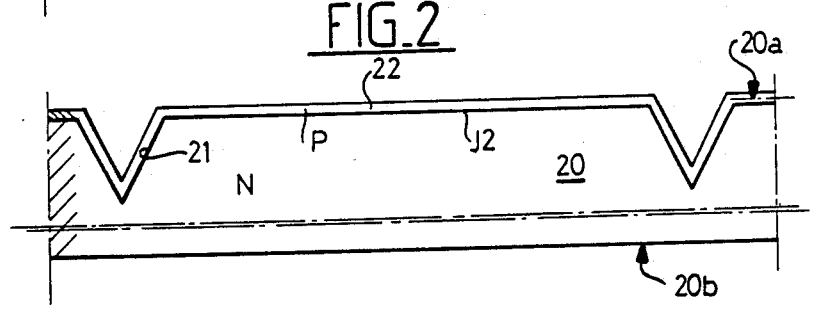

The following step (FIG. 3) consists in diffusing a P layer 22 in the face 20a of the slice so as to create a homojunction J2. The thickness of the layer 22 may be about 10 μm. This step is optional, as explained below, but it has the particular advantage of making the base region 22 highly reproducible.

Figure 4:
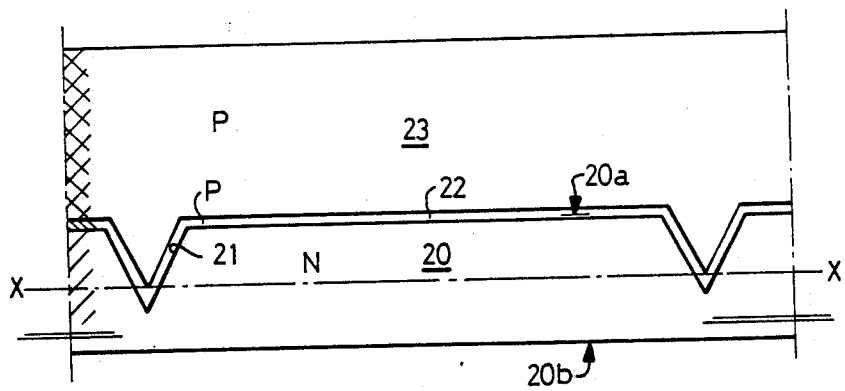

Thereafter (see FIG. 4), a thick layer 23 of P silicon is deposited on the P layer 22, or if there is no such layer, directly on the face 20a of the monocrystalline slice. The deposit 23 is obtained by an epitaxial type of method. The epitaxy is allowed to take place so as to generate a P layer which is essentially polycrystalline, i.e. it has a thin monocrystalline layer and is then polycrystalline through the major portion of its thickness.

As well as the advantage of speed, this procedure has further advantages explained below. The thickness of the epitaxial layer 23 may be about 200 μm to 400 μm.

The face 20b of the monocrystalline layer 20 is lapped or polished down to a plane X—X (FIG. 4) flush with the V-shaped tips of the grooves 21, thus determining a first main face S1 for the device (FIG. 5) with the second main face S2 of the device being constituted by the outside surface of the epitaxial layer 23. Being flush with the tips of the grooves is not critical because of the diffusion subsequently performed over said tips.

P diffusion is then performed on the face S1 in order to create firstly a P region 24 lying between the grooves 21 and forming a junction J1 with the N region 20, and secondly the peripheral slabs 25 overlying the grooves 21 so that the slabs and the grooves together constitute the required connections (FIG. 6). Alternatively, the regions 24 and the slabs 25 may be diffused separately.

If the doping of the epitaxial layer 23 is moderate, this layer is overdoped by P+diffusion from the face S2, preferably simultaneously with the diffusion of the zones 24 and 25 on the face S1. It is then possible to benefit from the fact that impurities diffuse much more quickly into the layer 23 of polycrystalline silicon than they do into the layer of monocrystalline silicon.

In a variant embodiment where the P layer 22 is not diffused immediately after etching the grooves, this buried layer is diffused from the epitaxial layer 23 which serves as a source of dopants, and this takes place simultaneously with the diffusion of the zones 24 and 25 providing the layer 23 is sufficiently doped to begin with. The layer 22 may also, in some cases, be diffused from the layer 23 simultaneously with said layer being overdoped.

In the variant embodiment where the P layer 22 is diffused immediately after etching the grooves, and when the layer 23 is overdoped by diffusion from the face S2, the layer 22 may advantageously contribute to the overdoping of the layer 23 on its face opposite to the face S2.

FIG. 7 shows N+zones 26 diffused into the region 24 in order to obtain a 4-layer PNPN device, e.g. of the thyristor type switched on by a trigger (GTO), whose main electrodes are referenced A(C), K(E), and whose control electrode is referenced G. The device could alternatively be a 3-layer PNP or NPN device.

The ability of the device to withstand a reverse voltage depends on critical zones referenced a for the junction J1 and b for the junction J2 and these zones may be protected in any conventional manner, e.g. by means of guard rings, field plates, etc., formed on or applied to the peripheral zone Z of the face S1 alone. The operations required for making contact, for passivation, ..., are conventional and are not described herein.

We claim:

1. A symmetrical power semiconductor device, comprising:
    an N/P first layer defining a first main face;
    a P/N second layer defining a second main face;
    the second layer coming flush with the first face by means of grooves obtained by etching;
    a P/N third layer formed between the first and second layers, including over the facettes of the grooves, and determining a junction with the first layer;
    a P/N fourth layer diffused on the first face in the first layer; and
    a P/N peripheral zone diffused on the first face so as to overlie the tips of the grooves and to form, together therewith, slabs for providing connections with the junction with the first face.

2. A device according to claim 1, in which the peripheral zone is formed simultaneously with the fourth layer.

3. A device according to claim 1, in which the grooves are V shaped and are obtained by anisotropic etching in a slice of monocrystalline silicon which is subsequently lapped down to the level of the first face.

4. A device according to claim 1, in which the second layer is obtained by an epitaxial type of deposit and is essentially polycrystalline.

5. A device according to claim 4, in which the second layer is P+/N+overdoped by a diffusion operation from the second main face.

6. A device according to claim 4, in which the second layer serves as a source of dopants for forming the third layer.

7. A device according to claim 1, in which diffused N+/P+zones are formed in the fourth layer.

* * * * *

UNITED STATES PATENT AND TRADEMARK OFFICE
CERTIFICATE OF CORRECTION

PATENT NO. : 4,963,971
DATED : October 16, 1990
INVENTOR(S) : Pierre Rosetti et al.

It is certified that error appears in the above—identified patent and that said Letters Patent is hereby corrected as shown below:

On the title page, item [30] should read as follows:
(30)     Foreign Application Priority Data
    Dec.7,1988 (FR)   France .................. 88 16062

Signed and Sealed this

Eighth Day of September, 1992

Attest:

DOUGLAS B. COMER

Attesting Officer           Acting Commissioner of Patents and Trademarks